US007091895B2

(12) United States Patent
Honma

(10) Patent No.: US 7,091,895 B2
(45) Date of Patent: Aug. 15, 2006

(54) A/D CONVERTER, DIGITAL PLL CIRCUIT USING THE SAME, AND INFORMATION RECORDING APPARATUS USING THE SAME

(75) Inventor: Hiromi Honma, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/957,385

(22) Filed: Oct. 1, 2004

(65) Prior Publication Data

US 2005/0073454 A1 Apr. 7, 2005

(30) Foreign Application Priority Data

Oct. 2, 2003 (JP) .............................. 2003/344053

(51) Int. Cl.
*H03M 1/00* (2006.01)

(52) U.S. Cl. .................... 341/155; 360/51; 375/375

(58) Field of Classification Search .............. 341/155; 327/157, 159; 375/375, 376; 360/51
See application file for complete search history.

(56) References Cited

U.S. PATENT DOCUMENTS 6,687,841 B1 * 2/2004 Marukawa ................. 713/500
6,873,668 B1 * 3/2005 Yamamoto et al. ......... 375/373
6,891,490 B1 * 5/2005 Hales ......................... 341/155
2003/0007273 A1 * 1/2003 Haraguchi et al. ........... 360/51
2004/0090355 A1 * 5/2004 Mayes ........................ 341/143

FOREIGN PATENT DOCUMENTS

| JP | H09-247136 | 9/1997 |
| JP | 11-031924 | 2/1999 |
| JP | 2002-217720 | 8/2002 |
| JP | 2003-078409 | 3/2003 |
| JP | 2003-115174 | 4/2003 |
| JP | 2003-209468 | 7/2003 |

* cited by examiner

*Primary Examiner*—Howard L. Williams
(74) *Attorney, Agent, or Firm*—Scully, Scott, Murphy & Presser, P.C.

(57) ABSTRACT

An A/D converter includes a low-bit resolution A/D which converts an input signal into a digital value of 4 bits or less, and a low-pass digital filter which suppresses a high-frequency-band component in an output from the low-bit resolution A/D, and extracts phase information contained in the input signal as amplitude information. A digital PLL circuit and information recording apparatus are also disclosed.

10 Claims, 5 Drawing Sheets

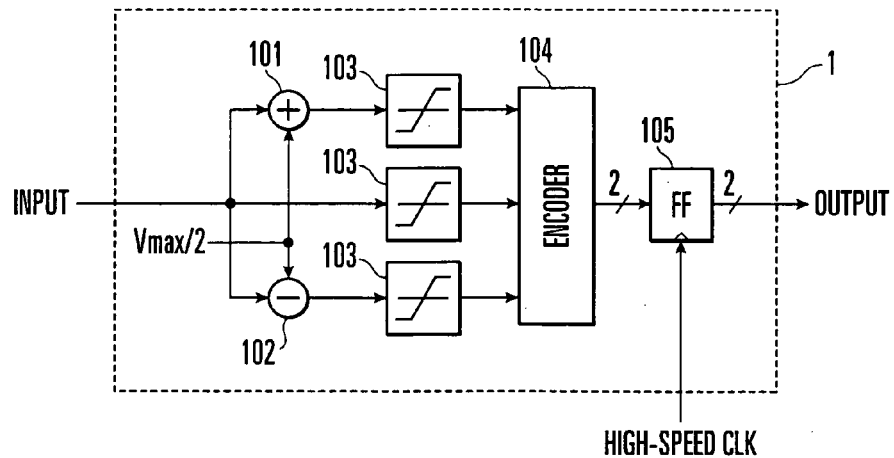
F I G. 2
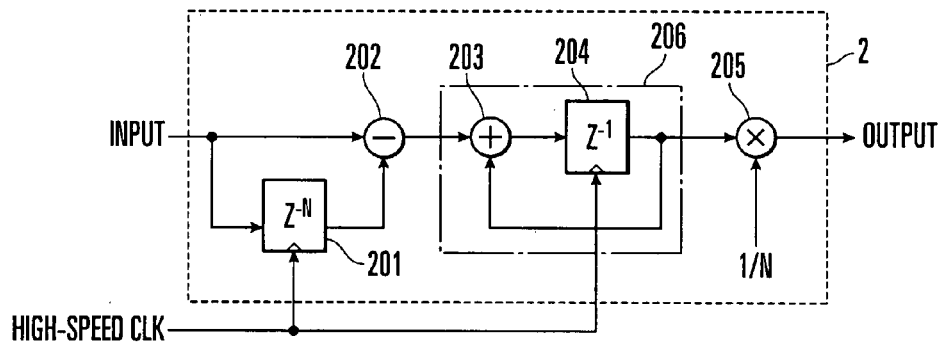
F I G. 3
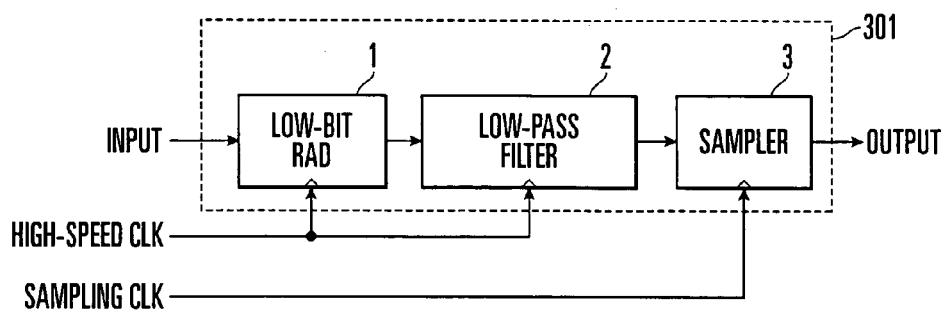
F I G. 4

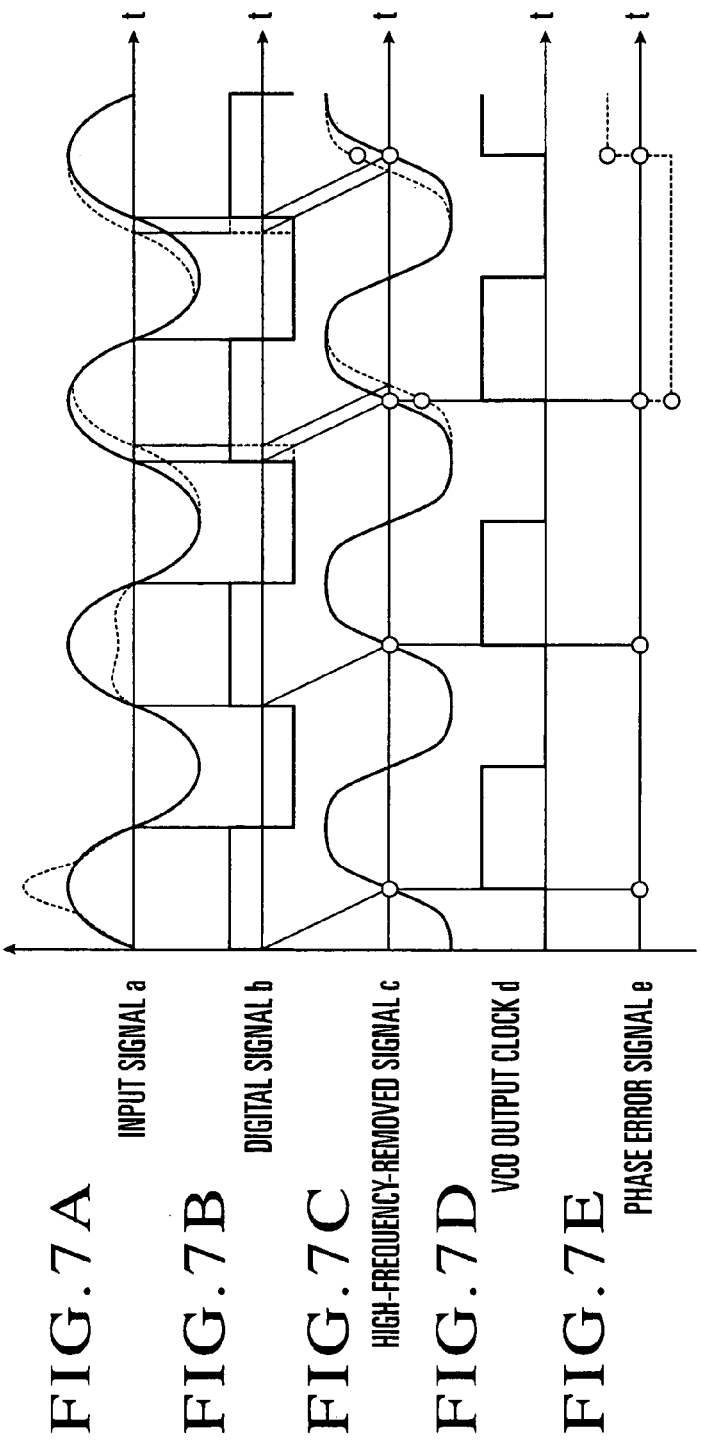
FIG.7A INPUT SIGNAL a
FIG.7B DIGITAL SIGNAL b
FIG.7C HIGH-FREQUENCY-REMOVED SIGNAL c
FIG.7D VCO OUTPUT CLOCK d
FIG.7E PHASE ERROR SIGNAL e
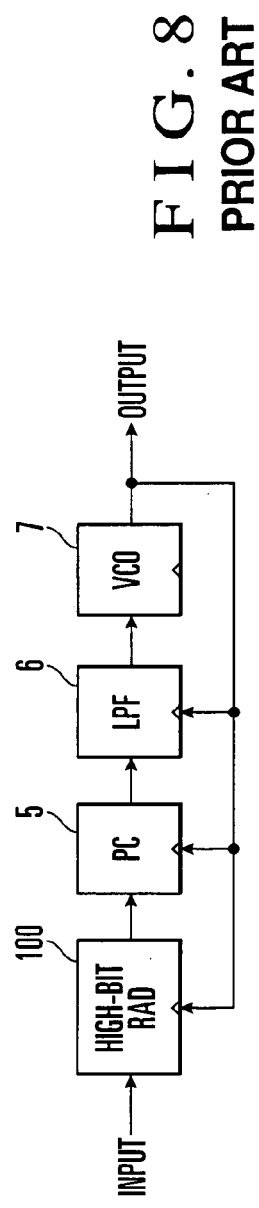
FIG.8
PRIOR ART

US 7,091,895 B2

A/D CONVERTER, DIGITAL PLL CIRCUIT USING THE SAME, AND INFORMATION RECORDING APPARATUS USING THE SAME

BACKGROUND OF THE INVENTION

The present invention relates to an A/D converter, digital PLL circuit, and information recording apparatus and, more particularly, to a digital PLL circuit which generates a recording clock, is suitably integrated into an LSI, and utilized in an information recording apparatus for an optical disk, and an information recording apparatus using the same.

Recording media represented by a CD (Compact Disc) and DVD (Digital Versatile Disc) can hold a large amount of information and process so-called AV (Audio-Visual) information. In recent years, information recording/playback apparatuses using such recording media have rapidly prevailed as a peripheral device of a personal computer and the like. In this situation, a recordable disk standard for a CD-R/RW, DVD-R/RW and DVD–R/RW must keep continuity between a recorded pit string and a newly recorded pit string in order to enable playback by a ROM player after recording.

For this purpose, tracking guide grooves which wobble at a specific frequency are formed in advance as pregrooves on such recording medium. In recording information, a wobble signal obtained from a wobbling tracking guide groove is read out, a recording clock phase-locked with the wobble signal is generated, and information is recorded. The wobble signal frequency is set in a high band exceeding the servo band of an optical head actuator and a band lower than the frequency band of recording information. This setting allows detecting a wobble signal even during tracking, and can increase the wobble signal quality.

For example, a DVD+R/RW has a wobble signal cycle 32 times longer than the recording clock cycle, and a DVD–R/RW has a wobble signal cycle 186 times longer than the recording clock cycle. By recording information by a recording clock synchronized with a wobble signal, information can be recorded at a correct position even with decentering of the disk. Even in sequential write, the phase precision of a wobble signal at the link can fall within a cycle of several recording clocks.

However, the quality of a wobble signal degrades owing to the presence/absence of information pit recording, contamination of the disk surface, and deterioration of the optical head. There has been proposed a digital signal processing technique of extracting a high-precision clock while compensating for degradation of the quality.

More specifically, the center frequency of a VCO (Voltage Controlled Oscillator) in a PLL (Phase Locked Loop) circuit is changed in accordance with externally supplied frequency information and timing information. The center frequency of a narrow-band BPF (Band Pass Filter) for limiting the band of an input signal is changed on the basis of a sync clock output from the PLL circuit. There has also been proposed a method of increasing the SNR (Signal-to-Noise Ratio) of a wobble signal by applying a digital signal process to the above-described technique (see Japanese Patent Laid-Open No. 2003-115174). The PLL circuit which generates a recording clock from a wobble signal is important because it determines the information recording quality of the disk.

In order to downsize the drive device and improve its reliability, the number of components must be decreased. At present, circuits which are distributed to several LSI (Large Scale Integrated circuit) chip sets have been developed to shrink into one chip set in the future. In this case, high stability, high yield, and low power consumption are important. When a full-digital PLL is integrated into an LSI, the same characteristic can be attained. However, a conventional configuration using an analog PLL suffers a change in PLL loop characteristic depending on the temperature characteristic or the like, and it is difficult to decrease the difference between LSIS. Thus, when an analog PLL is employed, for example, a PLL loop is constructed by adding a function of correcting the VCO temperature characteristic which is known in advance from an output from the temperature sensor (see Japanese Patent Laid-Open No. 2002-217720).

A digital PLL including a digital VCO requires a high-frequency operating clock because the digital PLL cannot obtain a phase resolution equal to or lower than the operating clock cycle. To avoid this, there have been proposed a configuration using a D/A converter and analog VCO (see Japanese Patent Laid-Open No. 2002-217720), and a method using a D/A converter and a DDS (Direct Digital frequency Synthesizer) by an SIN table (see Japanese Patent Laid-Open No. 11-31924).

However, a full-digital PLL using only an A/D converter and digital circuit, as shown in FIG. 8, is becoming feasible because of the following two reasons. First, the circuit operating speed increases with the advance of the LSI process technique. Second, a technique of increasing the phase precision by modulating the phase of an output clock edge without increasing the VCO operating clock has been developed (see Japanese Patent Laid-Open No. 2003-209468). As shown in FIG. 8, a conventionally proposed digital PLL circuit is formed from a high-bit resolution A/D (high-bit RAD) 100 with a bit width of 8 bits or the like, a low-pass digital filter 2, a sampler 3, a digital phase comparator 5, a digital loop filter 6, and a digital VCO 7. The high-bit resolution A/D 100 operates on the basis of a signal output from the digital VCO 7 or its frequency-divided signal as a clock.

Speedup competition for recording in a recordable DVD heats up now. For an N-time speed, the rotational speed of the disk is N times, and the digital circuit system must also operate at the N-time speed. This is inhibited by particularly the operation of the A/D converter in the above-mentioned digital PLL circuit. For example, for a DVD+R of 12×CAV (Constant Angular Velocity) operation, the wobble frequency at the outermost track is 24 MHz. A process such as digital BPF requires sampling of at least 96 Msps (sampling per second) which is four times higher than the wobble frequency. Thus, the circuit of the A/D converter comes to large scale because of digitization at about 8 bits.

The first problem to be solved is that when a digital PLL is mounted on an LSI, a high-speed A/D converter with a large circuit scale is necessary, and it is difficult to lay out the A/D converter together with another block. The second problem is that power consumption increases, it becomes difficult to dissipate heat, and the yield decreases because a high-speed A/D converter is necessary.

SUMMARY OF THE INVENTION

It is an object of the present invention to provide an A/D converter and full-digital PLL circuit which can generate a sync clock with a high phase precision even for a high-frequency input signal and are suitable for LSI integration.

It is another object of the present invention to provide an information recording apparatus capable of realizing high-speed information recording.

To achieve the above objects, according to the present invention, there is provided an A/D converter comprising a low-bit resolution A/D which converts an input signal into a digital value of not more than 4 bits, and a low-pass digital filter which suppresses a high-frequency-band component in an output from the low-bit resolution A/D, and extracts phase information contained in the input signal as amplitude information.

BRIEF DESCRIPTION OF THE DRAWINGS

FIG. 2 is a block diagram showing an example of a low-bit resolution A/D shown in FIG. 1;

FIG. 3 is a block diagram showing an example of a low-pass digital filter shown in FIG. 1;

FIG. 4 is a block diagram showing an A/D converter according to the second embodiment of the present invention;

FIGS. 7A to 7E are timing charts showing the operation of a digital PLL circuit when a 1-bit resolution A/D is used as the low-bit resolution A/D; and FIG. 8 is a block diagram showing a conventional digital PLL circuit.

DESCRIPTION OF THE PREFERRED EMBODIMENTS

The present invention will be described in detail below with reference to the accompanying drawings.

First Embodiment

Figure 1:
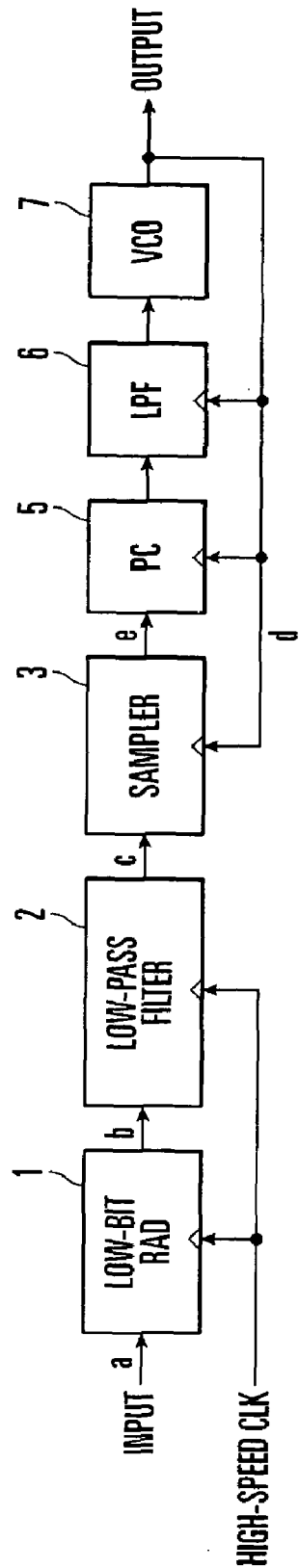
FIG. 1 is a block diagram showing a digital PLL circuit according to the first embodiment of the present invention.

As shown in FIG. 1, a digital PLL circuit according to the first embodiment comprises a low-bit resolution A/D (low-bit RAD) 1, low-pass digital filter 2, sampler 3, digital phase comparator 5, digital loop filter 6, and digital VCO 7 which are series-connected to each other. The low-bit resolution A/D 1 receives a signal, and the digital VCO 7 outputs a clock. The low-bit resolution A/D 1 and low-pass digital filter 2 receive a high-speed clock. The sampler 3, digital phase comparator 5, and digital loop filter 6 receive a clock (digital PLL output) output from the digital VCO 7.

A signal input to the low-bit resolution A/D 1 may be a signal on which noise is superposed, or an SIN-wave signal. The low-bit resolution A/D 1 may be configured to encode slicer results of different threshold levels. FIG. 2 shows an example of the 2-bit low-bit resolution A/D 1 formed from three slicers. In the low-bit resolution A/D 1 shown in FIG. 2, an input signal is input to slicers 103 directly or after Vmax/2 is added and subtracted by an adder 101 and subtractor 102. Input signals are classified into four levels (Vmax/2 or more, Vmax/2–0, 0–Vmax/2, and –Vmax/2 or less) by the slicers 103, and converted into a 2-bit signal by an encoder 104. The 2-bit signal output from the encoder 104 is latched by a flip-flop 105 at a high-speed clock, implementing high-speed A/D conversion.

An output from the low-bit resolution A/D 1 is filtered by the subsequent low-pass digital filter 2. At this time, if the quantization bit width increases, the circuit amount of the digital filter 2 increases, and it becomes difficult to operate the filter 2 at a high speed. Hence, a smaller quantization bit width of the low-bit resolution A/D 1 is more effective for downsizing of the circuit scale and reduction in power consumption. A practical upper limit is the width of a 4-bit resolution A/D formed from 15 slicers.

When a noise with a frequency near to DC is superposed into an input signal, in a 1-bit resolution A/D the SNR (Signal-to-Noise Ratio) drops owing to a decrease in the carrier energy of an output. Considering these facts, the quantization bit width of the low-bit resolution A/D 1 is properly 2 to 3 bits, which corresponds to two to seven slicers. The conversion speed of the low-bit resolution A/D 1 must be set higher than the operating frequency of the sampler 3. A higher conversion speed provides higher-precision phase information. Converted information is superposed on amplitude information by the low-pass digital filter 2 connected to the output side of the low-bit resolution A/D 1, obtaining the same performance as a high-bit resolution A/D.

The low-pass digital filter 2 converts phase information into amplitude information by limiting the band of an output from the A/D converter 1. For example, the low-pass digital filter 2 outputs 8-bit information for a 2-bit input. The low-pass digital filter 2 must operate at a high speed with respect to a sampling clock, which can be easily implemented using a configuration shown in FIG. 3. Referring to FIG. 3, in the low-pass digital filter 2, a subtractor 202 generates the difference between an input signal delayed by N cycles by an N-cycle delay unit 201 and the input signal itself. An integrator 206 formed from a 1-cycle delay unit 204 and adder 203 integrates an output from the subtractor 202. A multiplier 205 normalizes the gain of an output from the integrator 206. A transfer function G1 of the low-pass digital filter 2 is given by $$G1=(1-Z^{-N})*Z^{-1}/(1-Z^{-1})/N \qquad (1)$$

Equation (1) is rewritten into $$G1=(Z^{-1}+Z^{-2}+Z^{-3}+\ldots+Z^{-N})/N \qquad (2)$$

Figure 6:
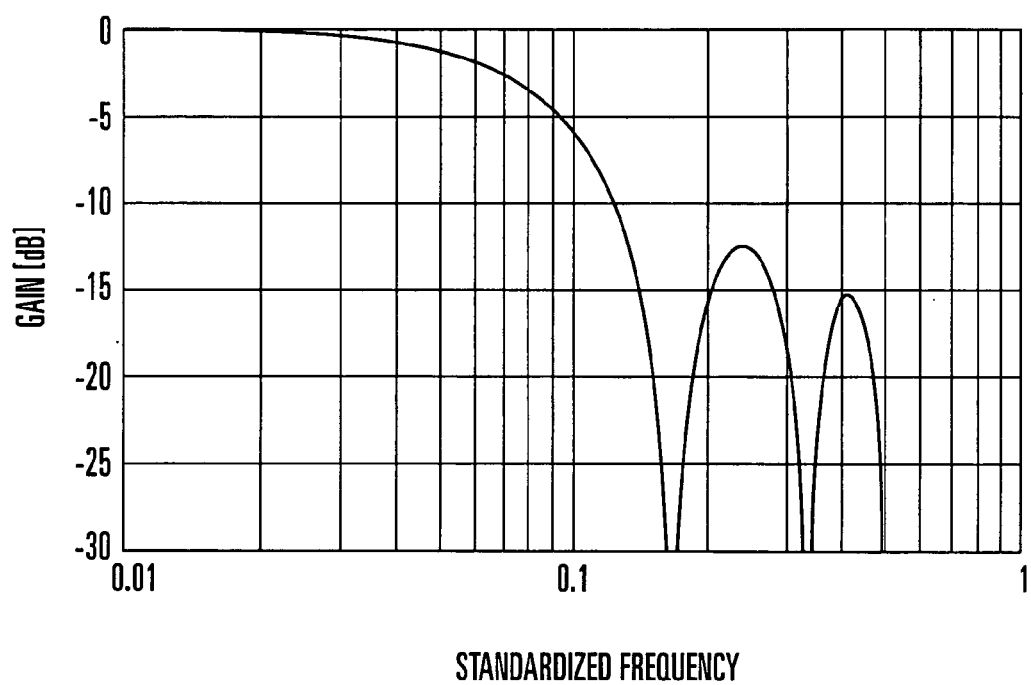
FIG. 6 is a graph showing an example of the frequency characteristic of the low-pass digital filter shown in FIG. 1.

That is, the low-pass digital filter 2 is equal to an N-tap FIR (Finite Impulse Response) filter in which all coefficients are 1/N. This filter is an LPF (Low Pass Filter), and the cutoff frequency can be changed by N. FIG. 6 shows the frequency characteristic for, e.g., N=6. Multiple filters of this type may be series-connected to each other. The low-pass digital filter 2 also functions as an anti-aliasing filter for the sampler 3 connected to the output side of the low-pass digital filter 2. The cutoff frequency is therefore set to 50% or less of the sampling clock frequency of the sampler 3. Since an output from the low-bit resolution A/D 1 contains a small amount of amplitude information but has a high phase precision, phase information can be superposed in the amplitude direction through the low-pass digital filter 2. An output from the low-pass digital filter 2 has a high precision near the edge, but contains a small amount of information at the remaining portion. However, the PLL uses information near the edge, and a sync clock can be generated at high precision.

The sampler 3 samples and holds an output value from the low-pass digital filter 2 in response to a clock generated from an output from the digital VCO 7. The input signal frequency of the digital PLL is much lower than the operating speeds of the conversion circuit 1 and low-pass digital filter 2. A general digital signal process after digital conversion suffices to be higher twice or more of the input signal frequency from the sampling theorem. The digital phase comparator 5 and digital loop filter 6 which are connected to the output side of the sampler 3 need not be operated at the same speed as that of the low-pass digital filter 2. From the viewpoint of power consumption, a signal is preferably decimated to a low rate by the sampler 3, and then input to the digital phase comparator 5 and digital loop filter 6.

The digital phase comparator 5 receives an output from the sampler 3, and generates phase error information. When the input frequency of the conversion circuit 1 and the oscillation frequency of the digital VCO 7 coincide with each other, an output from the sampler 3 and an output from the digital phase comparator 5 are equal to each other, and either the sampler 3 or digital phase comparator 5 suffices to be employed. When the oscillation frequency of the digital VCO 7 is N times higher than the input frequency, the digital phase comparator 5 outputs input information every N cycles or outputs information at a timing at which the sign of pieces of successive input information change. In order to remove an unnecessary frequency component contained in an input signal, a band-pass filter such as a digital BPF may be inserted on the input side of the digital phase comparator 5.

The digital loop filter 6 controls the oscillation frequency of the digital VCO 7 on the basis of phase error information output from the digital phase comparator 5. That is, the digital loop filter 6 outputs to the digital VCO 7 a control signal corresponding to the phase error information from the digital phase comparator 5. The oscillation frequency of the digital VCO 7 is controlled in accordance with a control signal from the digital loop filter 6.

A transfer characteristic G2 of the digital loop filter is one (digital loop filter 63) given by $$G2 = \omega 0/s + 1 \quad (3)$$

where s is the Laplace operator and $\omega 0$ is the zero-point angular frequency.

Since the digital loop filter is formed from a digital circuit, a transfer function G3 in the use of a time delay element $Z^{-1}$ is given by $$G3 = \omega 0/T * Z^{-1}/(1 - Z^{-1}) + 1 \quad (4)$$

where T is the operating clock cycle of a digital VCO circuit.

The digital VCO 7 is operated at a clock of a speed as high as possible in order to ensure phase resolution. The output clock of the digital VCO 7 whose frequency is controlled by an output from the digital loop filter 6 controls the operations of the sampler 3, digital phase comparator 5, and digital loop filter 6, thereby constituting a PLL loop. A clock signal phase-locked with an input to the conversion circuit 1 is generated.

The operation of the first embodiment will be explained in more detail with reference to FIGS. 7A to 7E. Signals a to e shown in FIGS. 7A to 7E correspond to signals (paths) a to e shown in FIG. 1. An input signal a is converted into a digital signal b via the 1-bit low-bit resolution A/D 1. As described above, the digital signal b has a large amount of information near the edge of an input signal, and a change near the edge can be faithfully converted for an input as represented by a broken line. However, the digital signal b looses amplitude information at a portion not near the edge. The digital signal b is converted into a high-frequency-removed signal c via the low-pass digital filter 2. The high-frequency-removed signal c holds phase shift information of the input signal a. The high-frequency-removed signal c is sampled at the rise of an output clock d from the digital VCO 7, obtaining a phase error signal e. That is, phase shift information of the input signal a can be converted as amplitude information of the phase error signal e. PLL operation can be implemented using the phase error signal e.

Second Embodiment

An A/D converter according to the second embodiment of the present invention will be described with reference to FIG. 4. Referring to FIG. 4, an A/D converter 301 in a broad sense comprises an low-bit resolution A/D 1, low-pass digital filter 2, and sampler 3. A high-speed CLK which regulates the operations of the low-bit resolution A/D 1 and low-pass digital filter 2 is set much higher than the sampling CLK of the sampler 3. Compared to a general A/D converter, the A/D converter 301 exhibits a low precision of amplitude information at a portion other than a portion near the edge, but can be utilized as an A/D converter for demodulating, e.g., a frequency- or phase-modulated signal.

Third Embodiment

Figure 5:
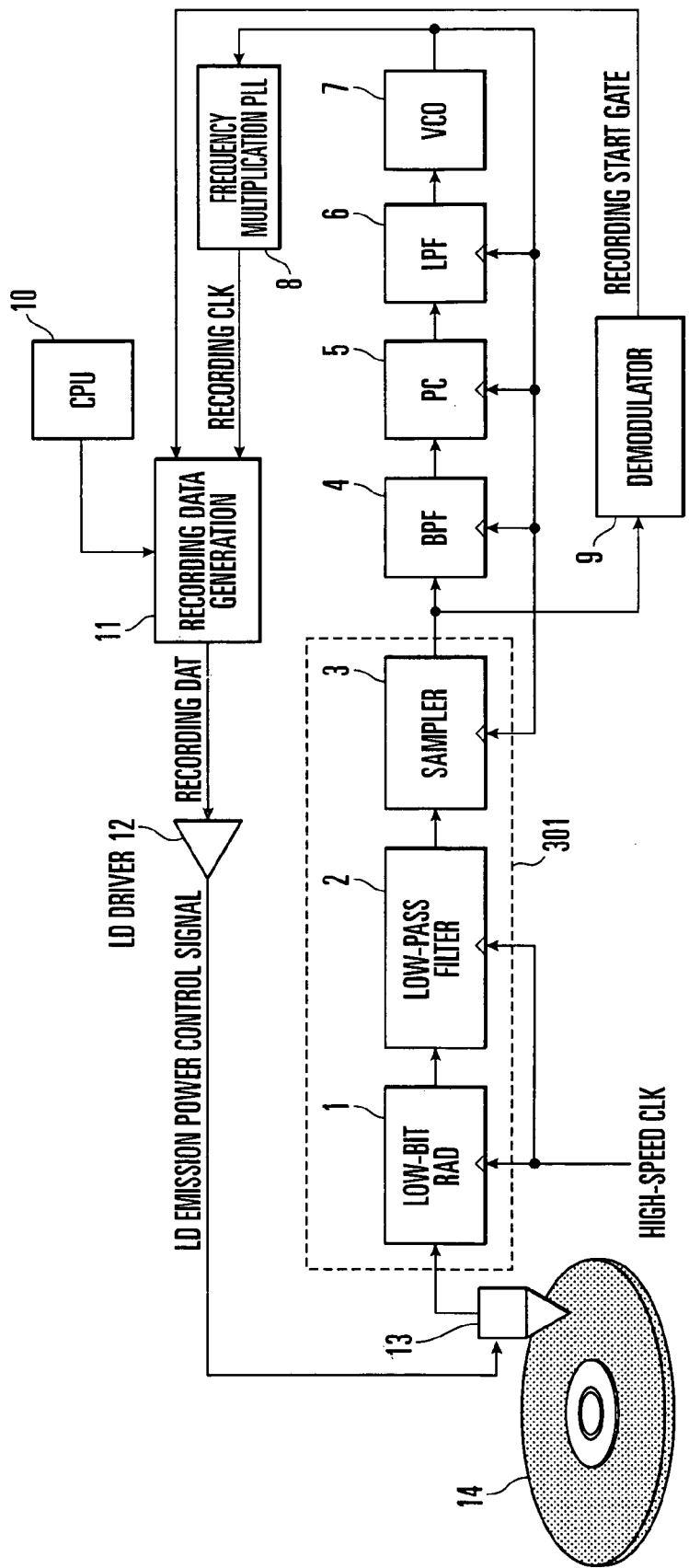
FIG. 5 is a block diagram showing an information recording apparatus according to the third embodiment of the present invention.

An optical disk information recording apparatus according to the third embodiment of the present invention will be described with reference to FIG. 5. Wobble information is superposed on a push-pull signal read from by an optical head 13 from an optical disk 14 having a guide groove wobbled at a frequency untrackable by the tracking actuator of the optical head 13. An A/D converter 301 formed from a conversion circuit 1, low-pass digital filter 2, and sampler 3 extracts, from the signal, phase information of the wobble signal as digital information. The band of the digital information is limited by a band-pass digital filter 4, and then phase error information is generated by a digital phase comparator 5. A control signal corresponding to the phase error information generated by the digital phase comparator 5 is generated by a digital loop filter 6. The control signal corrects frequency information for a digital VCO 7.

The output clock frequency of the digital VCO 7 is controlled by the corrected frequency information. The sampler 3 operates in synchronism with the output clock of the digital VCO 7 to form a PLL loop. The loop outputs a stable clock signal synchronized with the input wobble signal. In general, the recording clock of the optical disk information recording apparatus is about 30 to 200 times higher than the wobble frequency. In order to further multiply the frequency of the clock generated by the digital PLL, a recording clock is generated by a frequency multiplication PLL 8. The recording start timing is generally generated on the basis of information embedded in a wobble signal. For example, for a DVD+R, the information is embedded as wobble phase-modulated information.

A demodulator 9 decodes phase-modulated information from an output from the sampler 3 or band-pass digital filter 4, and generates a recording start gate. Upon reception of the recording start gate, a CPU 10 and recording data generation means 11 generate a recording data string at a timing synchronized with the recording clock.

The recording data string is converted into LD emission power by an LD driver 12, and recorded on the optical disk 14 via the optical head 13. In this manner, information can be recorded on the optical disk 14 at high phase precision even with decentering of the disk, rotational variations of the spindle motor, or the like.

As has been described above, a digital PLL circuit according to the present invention generates, by the low-bit resolution A/D capable of high-speed operation, information 2 to 3 bits wide which has a low amplitude resolution but a high phase resolution. The digital PLL circuit corrects the frequency characteristic of the information by the low-pass digital filter so as to be able to extract phase shift information as amplitude information. After that, the digital PLL circuit samples the information by the sampler using a digital VCO output clock. The low-pass digital filter is inserted to remove aliasing (folding noise) of an output from the subsequent sampler, and supplies a cutoff frequency which is ½ or less the sampling frequency. With this configuration, an A/D converter which operates at a high speed with a small circuit scale can be implemented to facilitate LSI integration.

Input information necessary for the PLL is phase error information. In order to digitally process time difference information without any change, a very high operating clock is necessary. When the high-frequency component of an input signal is removed, slew rate (waveform change rate) decreases, and phase information and amplitude information become almost proportional to each other near the edge of an input signal (see FIGS. 7A to 7E). That is, a digital PLL can be implemented by digitally processing phase information as amplitude information. Since the digital PLL requires phase information near the edge of an input signal, a high-precision digital PLL can be implemented as far as information near the edge can be obtained at sufficient precision. A conventional digital PLL adopts a resolution A/D about 8 bits wide, but if amplitude information of an input signal is permitted to diminish, such high-bit A/D converter is not necessary.

In the digital PLL circuit according to the present invention, the low-bit resolution A/D of about 2 to 3 bits converts in advance an input signal into a digital value at a speed higher than an actual sampling speed. The resolution A/D has a small circuit scale, and can operate at a very high speed. An output from the resolution A/D contains a small amount of amplitude information, but has a high phase precision. Phase information can therefore be superposed in the amplitude direction via the low-pass digital filter. An output from the low-pass digital filter exhibits a high precision near the edge, but contains a small amount of information at the remaining portion. This is because the number of original bits of an output from the resolution A/D is small. However, the PLL requires phase information near the edge, as described above, and a simple A/D converter according to the present invention can attain satisfactory performance.

According to the present invention, a high-speed, high-precision digital PLL circuit can be easily integrated into an LSI. Also, the present invention can achieve a small-scale LSI mounting the digital PLL circuit, low power consumption, and high yield.

What is claimed is:

1. An A/D converter comprising:
a low-bit resolution A/D which converts an input signal into a digital value of not more than 4 bits;
a low-pass digital filter which suppresses a high-frequency-band component in an output from said low-bit resolution A/D, and extracts phase information contained in the input signal as amplitude information; and
a sampler for sampling and holding the amplitude information output from said low-pass digital filter in response to a sampling clock, the sampling clock having a frequency set lower than each of operating speeds of said low-bit resolution A/D and said low-pass digital filter.

2. A converter according to claim 1, wherein said low-pass digital filter comprises a delay unit which delays a filter input, and an integrator which integrates a difference between the filter input and an output from said delay unit.

3. A converter according to claim 1, wherein said low-bit resolution A/D comprises a plurality of slicers which classify input signals into a plurality of levels, and an encoder which encodes outputs from said plurality of slicers and converts the outputs into information of a plurality of bits.

4. A converter according to claim 3, wherein the number of slicers is two to seven, and said encoder converts outputs from said plurality of slicers into information of 2 to 3 bits.

5. A converter according to claim 1, wherein a cutoff frequency of said low-pass digital filter is set to not more than ½ the sampling clock used by said sampler.

6. A digital PLL circuit comprising:
an A/D converter having a low-bit resolution A/D which converts an input signal into a digital value of not more than 4 bits, and a low-pass digital filter which suppresses a high-frequency-band component in an output from said low-bit resolution A/D, and extracts phase information contained in the input signal as amplitude information;
a digital phase comparator which outputs phase difference information between an output from said A/D converter and a digital PLL output;
a digital loop filter which outputs a control signal corresponding to the phase difference information from said digital phase comparator;
a digital VCO whose oscillation frequency is controlled as the digital PLL output on the basis of the control signal from said digital loop filter, wherein the oscillation frequency of said digital VCO is set lower than each of operating speeds of said low-bit resolution A/D and said low-pass digital filter; and
a band-pass digital filter which is connected between said A/D converter and said phase comparator, and operates at a timing of a clock obtained from an output from said digital VCO.

7. A digital PLL circuit comprising:
a low-bit resolution A/D which converts an input signal into a digital value of not more than 4 bits;
a low-pass digital filter which suppresses a high-frequency-band component in an output from said low-bit resolution A/D;
a sampler which samples and holds an output from said digital filter in response to a sampling clock, said sampling clock having a frequency set lower than each of operating speeds of said low-bit resolution A/D and said low-pass filter;
a digital loop filter which outputs a control signal corresponding to a hold output from said sampler; and
a digital VCO whose oscillation frequency value is controlled on the basis of the control signal from said digital loop filter, wherein the oscillation frequency of said digital VCO is set lower than each of operating speeds of said low-bit resolution A/D and said low-pass digital filter.

8. A circuit according to claim 7, wherein an output from said digital VCO is supplied as the sampling clock to said sampler.

9. An information recording apparatus comprising:
a digital PLL circuit which receives a signal depending on a recording medium scanning signal;
a frequency multiplication PLL which multiplies a frequency of an output clock from said digital PLL circuit to generate a recording clock; and
information recording means for recording information on a recording medium in synchronism with the recording clock output from said frequency multiplication PLL, said digital PLL circuit comprising:

an A/D converter having a low-bit resolution A/D which converts an input signal into a digital value of not more than 4 bits, and a low-pass digital filter which suppresses a high-frequency-band component in an output from said low-bit resolution A/D, and extracts phase information contained in the input signal as amplitude information, a digital phase comparator which outputs phase difference information between an output from said A/D converter and a digital PLL output, a digital loop filter which outputs a control signal corresponding to the phase difference information from said digital phase comparator, and a digital VCO whose oscillation frequency is controlled as the digital PLL output on the basis of the control signal from said digital loop filter, and the oscillation frequency of said digital VCO being set lower than each of operating speeds of said low-bit resolution A/D and said low-pass digital filter.

10. An information recording apparatus comprising:

a digital PLL circuit which receives a signal depending on a recording medium scanning signal;

a frequency multiplication PLL which multiplies a frequency of an output clock from said digital PLL circuit to generate a recording clock; and information recording means for recording information on a recording medium in synchronism with the recording clock output from said frequency multiplication PLL, said digital PLL circuit comprising:

a low-bit resolution A/D which converts an input signal into a digital value of not more than 4 bits, a low-pass digital filter which suppresses a high-frequency-band component in an output from said low-bit resolution A/D, a sampler which samples and holds an output from said digital filter in response to a sampling clock, a digital loop filter which outputs a control signal corresponding to a hold output from said sampler, and a digital VCO whose oscillation frequency value is controlled on the basis of the control signal from said digital loop filter, and the oscillation frequency of said digital VCO being set lower than each of operating speeds of said low-bit resolution A/D and said low-pass digital filter.

* * * * *